US012684684B2

(12) United States Patent
Kawazu

(10) Patent No.: US 12,684,684 B2
(45) Date of Patent: Jul. 14, 2026

(54) WIRING BOARD AND ELECTRONIC DEVICE

(71) Applicant: KYOCERA Corporation, Kyoto (JP)

(72) Inventor: Yoshiki Kawazu, Omihachiman (JP)

(73) Assignee: KYOCERA CORPORATION, Kyoto (JP)

( * ) Notice: Subject to any disclaimer, the term of this patent is extended or adjusted under 35 U.S.C. 154(b) by 218 days.

(21) Appl. No.: 18/715,817

(22) PCT Filed: Dec. 1, 2022

(86) PCT No.: PCT/JP2022/044308
§ 371 (c)(1),
(2) Date: Jun. 3, 2024

(87) PCT Pub. No.: WO2023/100964
PCT Pub. Date: Jun. 8, 2023

(65) Prior Publication Data
US 2026/0122768 A1     Apr. 30, 2026

(30) Foreign Application Priority Data
Dec. 3, 2021     (JP) ................................. 2021-196776

(51) Int. Cl.
*H05K 1/02*          (2006.01)

(52) U.S. Cl.
CPC . *H05K 1/0245* (2013.01); *H05K 2201/09036* (2013.01); *H05K 2201/09227* (2013.01); *H05K 2201/09236* (2013.01)

(58) Field of Classification Search
CPC ................... H05K 1/0245; H05K 2201/09036
USPC .......................................................... 174/250
See application file for complete search history.

(56) References Cited

U.S. PATENT DOCUMENTS

2011/0139489 A1*   6/2011   Yoon .................... H05K 1/0227
                                                    174/250
2012/0125536 A1*   5/2012   Morimoto ........... H10P 72/0428
                                                    156/580

FOREIGN PATENT DOCUMENTS

JP          2002-057513 A     2/2022

* cited by examiner

*Primary Examiner* — Andargie M Aychillhum
(74) *Attorney, Agent, or Firm* — Volpe Koenig

(57)          ABSTRACT
A wiring board includes an insulating substrate including a first surface, a mount portion positioned on the first surface and equipped with an electronic element, a first signal line and a second signal line positioned parallel to each other on the first surface, and a recess positioned on the first surface. The recess is positioned around a first end as an end of the first signal line and a second end as an end of the second signal line. At least part of the recess, the first end, and the second end are overlapped with the mount portion in a planar view.

13 Claims, 8 Drawing Sheets

FIG. 3

WIRING BOARD AND ELECTRONIC DEVICE

TECHNICAL FIELD

The present disclosure relates to a wiring board and an electronic device.

BACKGROUND OF INVENTION

An electrode on a wiring board and an electrode on a lower surface of an electronic element may be electrically connected to each other while facing each other (e.g., flip chip mounting according to JP2022-57513A).

SUMMARY

Solution to Problem

According to the present disclosure, a wiring board includes an insulating substrate, a mount portion, a first signal line and a second signal line, and a recess. The insulating substrate includes a first surface. The mount portion is positioned on the first surface and equipped with an electronic element. The first signal line and the second signal line are positioned parallel to each other on the first surface. The recess is positioned on the first surface. The recess is positioned around a first end of the first signal line and a second end of the second signal line. At least part of the recess, the first end, and the second end are overlapped with the mount portion in a planar view.

According to the present disclosure, an electronic device includes the wiring board and an electronic element mounted on the mount portion.

BRIEF DESCRIPTION OF THE DRAWINGS

FIG. 3 is an enlarged plan view of a transmission path on the wiring board according to embodiment 1.

DESCRIPTION OF EMBODIMENTS

Embodiments of the present disclosure will be described in detail hereinafter with reference to the drawings.

Figure 1:
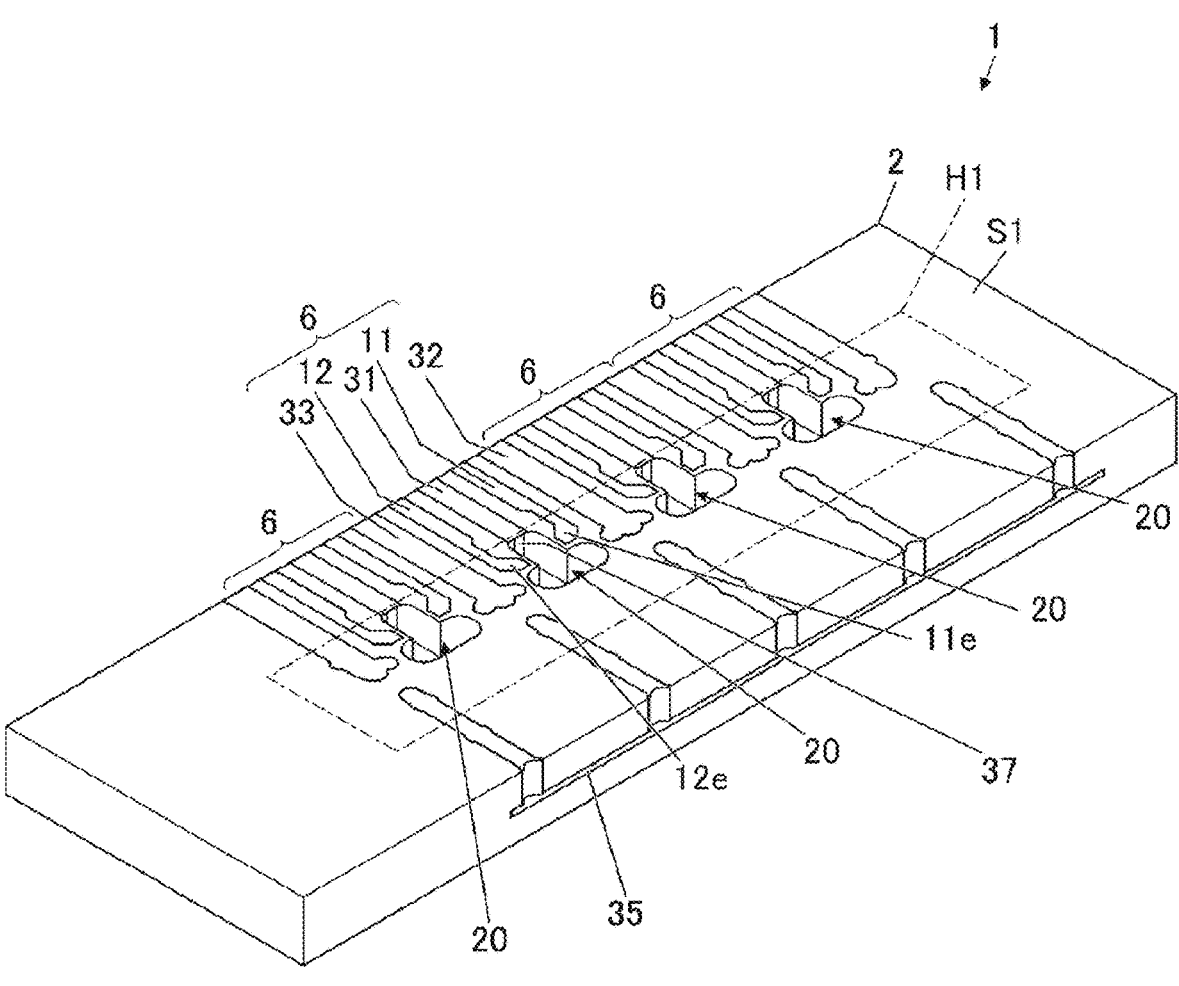
FIG. 1 is a perspective view of a wiring board according to embodiment 1 of the present disclosure.
Figure 2A:
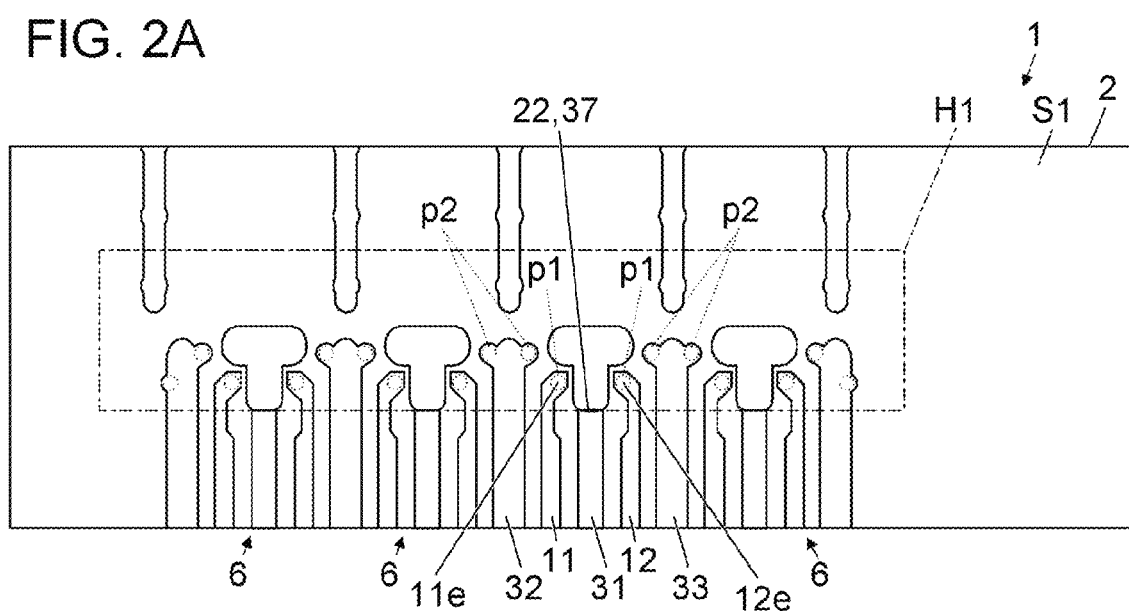
FIG. 2A is a plan view of a first surface of the wiring board according to embodiment 1.
Figure 2B:
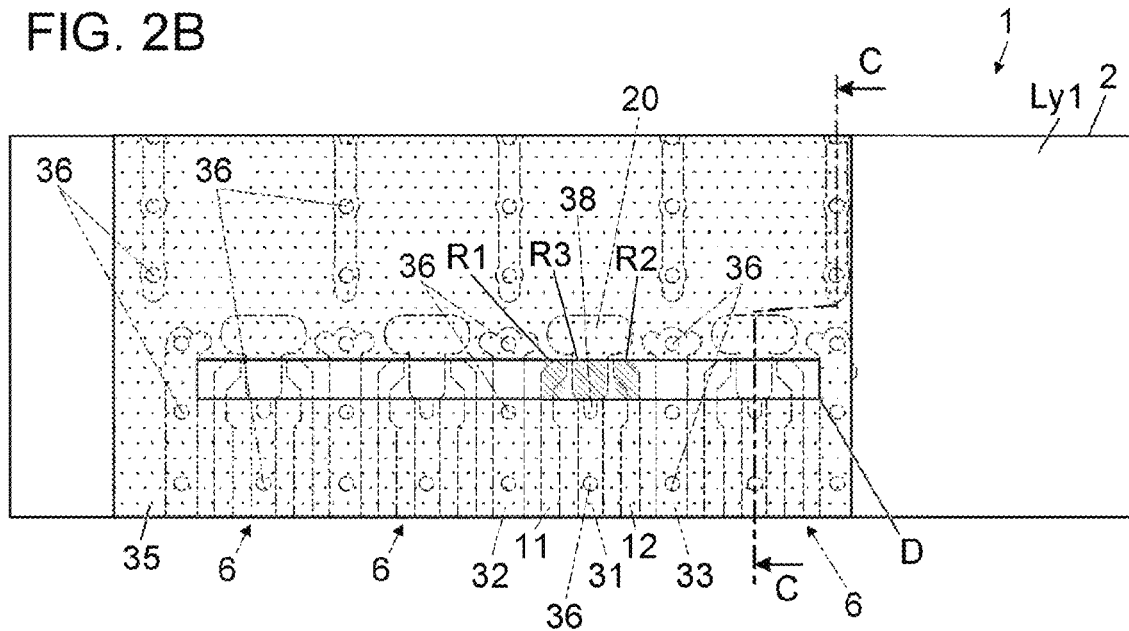
FIG. 2B is a plan view of a first conductor layer of the wiring board according to embodiment 1.
Figure 2C:
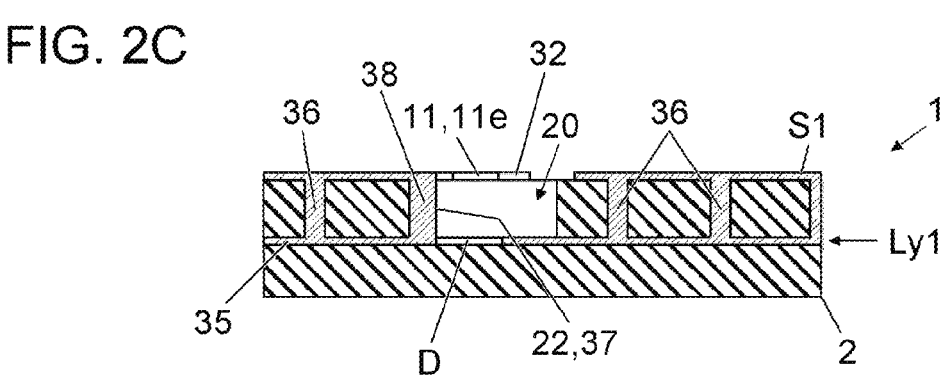
FIG. 2C is a sectional view taken along line C-C in FIG. 2B.
Figure 3:
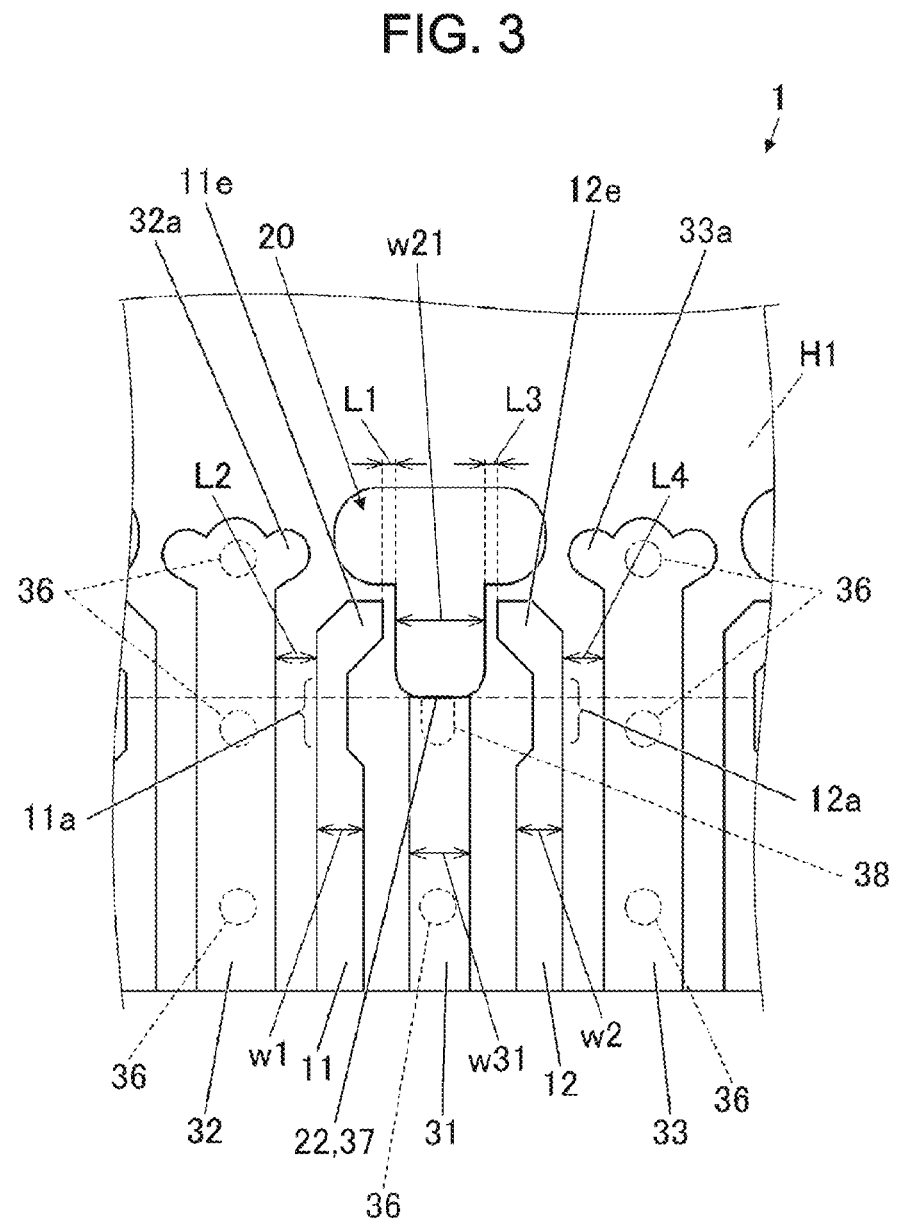

FIG. 1 is a perspective view of a wiring board according to embodiment 1 of the present disclosure. FIGS. 2A to 2C each illustrate the wiring board according to embodiment 1. FIG. 2A is a plan view of a first surface, FIG. 2B is a plan view of a first conductor layer, and FIG. 2C is a sectional view taken along line C-C in FIG. 2B. FIG. 2B illustrates structures above the first conductor layer by virtual lines. FIG. 3 is an enlarged plan view of a transmission path on the wiring board according to embodiment 1.

Embodiment 1 provides a wiring board 1 including an insulating substrate 2 including a first surface S1, a first signal line 11 and a second signal line 12 positioned on the first surface S1, a recess 20 positioned on the first surface S1, and a mount portion H1 equipped with an electronic element. The wiring board 1 may further include a first ground line 31, a second ground line 32, and a third ground line 33 positioned in the first surface S1, a ground film conductor 35 positioned on a first conductor layer Ly1 of the insulating substrate 2, and a plurality of ground via conductors 36 and one or a plurality of side surface ground conductors 37 positioned between the first conductor layer Ly1 and the first surface S1 of the insulating substrate 2.

The first signal line 11 and the second signal line 12 may be parallel to each other. Being parallel means that a line extends along another line and that the both lines are aligned in lateral directions of the lines. The first signal line 11 and the second signal line 12 may be a pair of signal lines configured to transmit a differential signal.

The first to third ground lines 31 to 33 may be parallel to the first signal line 11 and the second signal line 12. The first ground line 31 may be positioned between the first signal line 11 and the second signal line 12. The second ground line 32 may be positioned opposite to the second signal line 12 with respect to the first signal line 11. The third ground line 33 may be positioned opposite to the first signal line 11 with respect to the second signal line 12.

Assuming that the first signal line 11, the second signal line 12, the recess 20, and the first to third ground lines 31 to 33 constitute a set of transmission paths 6, the wiring board 1 may include plural sets of transmission paths 6. The plural sets of transmission paths 6 may be parallel to each other. When the wiring board includes the plural sets of transmission paths 6, the second ground line 32 in one of a pair of transmission paths 6 adjacent to each other and the third ground line 33 in the other one of the pair of transmission paths 6 may be provided in common with each other.

The first surface S1 may be provided with a first end 11e as an end of the first signal line 11. The first end 11e may be an electrode part electrically connected to an electrode of the electronic element. In the same or a similar manner, the first surface S1 may be provided with a second end 12e as an end of the second signal line 12. The second end 12e may be an electrode part electrically connected to an electrode of the electronic element. FIG. 2A includes electrode positions p1 and p2 each indicating a position connected to the electrode of the electronic element via a connector such as a copper pillar.

The recess 20 may be positioned around the first end 11e and the second end 12e. The recess 20 may have an internal space. The recess 20 may alternatively contain an insulating material lower in relative dielectric constant than the insulating substrate 2. The recess 20 may have a depth reaching the ground film conductor 35, may be shallower than the depth (e.g., ½ or ⅓ of the depth), or may be deeper than the depth.

Positioning the recess 20 around a certain target means that a distance between the recess 20 and the target is equal to or less than twice a line width w1 (see FIG. 3) of the first signal line 11. The line width w1 of the first signal line 11 may be equal to a line width w2 of the second signal line 12. Assume that the line width w1 of the first signal line 11 corresponds to a line width in more than a half-range in a longitudinal direction in a case where the first signal line 11 has an inconstant line width. Line width is the width in a lateral direction of a signal line. The recess 20 positioned around the first end 11e and the second end 12e can affect impedance of a transmission path in the vicinity of the first end 11e and the second end 12e. A distance between the recess 20 and each of the first end 11e and the second end 12e may be equal to or less than the line width w1. In this case, the recess 20 can enhance an action on the impedance of the transmission path.

In a planar view, at least part of the recess 20, as well as the first end 11e and the second end 12e, may be overlapped with the mount portion H1. Planar view means viewing in a direction vertical to the first surface S1. Plan perspective view means perspectively viewing in a direction vertical to the first surface S1.

Examples of a shape of the recess 20 may include an oblong shape, a circular shape, an elliptical shape, and a rectangular shape, as well as a shape obtained by combining any of an oblong shape, a circular shape, an elliptical shape, a rectangular shape, and the like, with no particular limitation. The recess may have a shape appropriate for a design condition.

FIGS. 4A to 4E are plan views of recesses 20 according to variations 1 to 5, respectively. As illustrated in FIGS. 4A to 4E, the recess 20 may be positioned anywhere on the first surface S1 as long as at least part of the recess is overlapped with the mount portion H1 and is positioned around both of the first end 11e and the second end 12e.

Figure 4A:
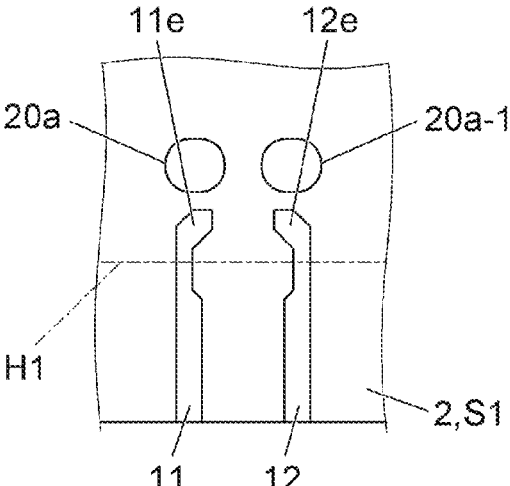
FIG. 4A is a plan view of recesses according to variation 1.
Figure 4B:
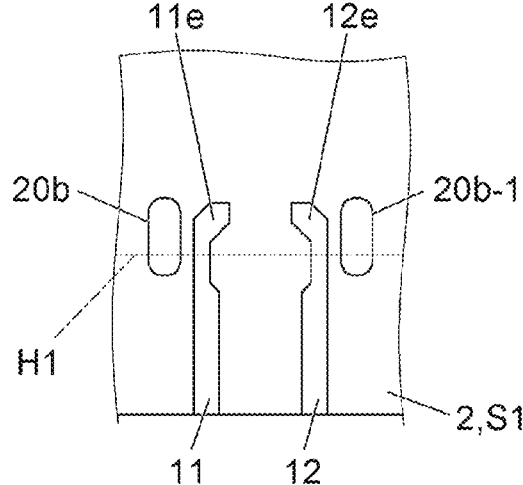
FIG. 4B is a plan view of recesses according to variation 2.
Figure 4C:
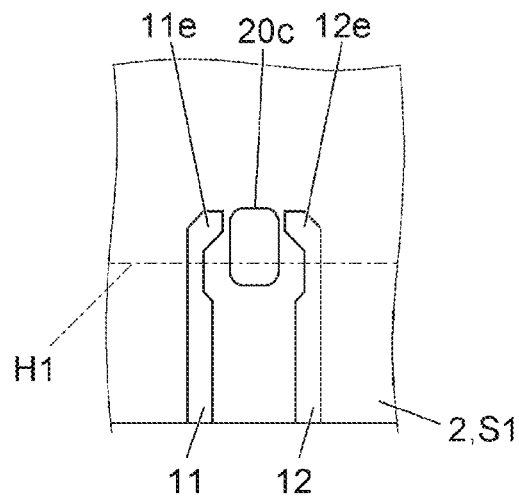
FIG. 4C is a plan view of recesses according to variation 3.
Figure 4D:
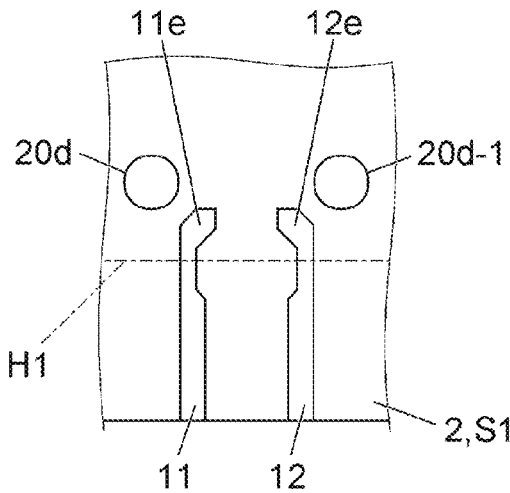
FIG. 4D is a plan view of recesses according to variation 4.
Figure 4E:
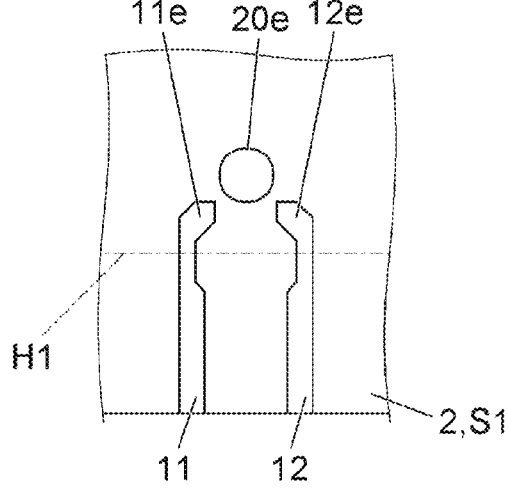
FIG. 4E is a plan view of recesses according to variation 5.

Specifically, as illustrated in FIG. 4A, the recess 20 corresponding to the first end 11e may be a recess 20a positioned on an extension of the first signal line 11 (in other words, opposite to the first signal line 11 with respect to the first end 11e). As illustrated in FIGS. 4B and 4C, the recess 20 corresponding to the first end 11e may alternatively be a recess 20b or a recess 20c positioned laterally with respect to the first end 11e (in other words, in a direction along the first surface S1 and perpendicular to the longitudinal direction of the first signal line 11). As illustrated in FIGS. 4D and 4E, the recess 20 corresponding to the first end 11e may still alternatively be a recess 20d or 20e positioned in a diagonal direction of the first end 11e (in other words, a direction between the longitudinal direction and a lateral direction of the first signal line 11).

Still alternatively, the recess 20 corresponding to the first end 11e may be formed by combining a plurality of recesses in the recesses 20a to 20e. In the case where the plurality of recesses in the recesses 20a to 20e are combined, the plurality of recesses thus combined may be disposed continuously or non-continuously.

In the same or a similar manner, as illustrated in FIG. 4A, the recess 20 corresponding to the second end 12e may be a recess 20a-1 positioned on an extension of the second signal line 12 (in other words, opposite to the second signal line 12 with respect to the second end 12e). As illustrated in FIGS. 4B and 4C, the recess 20 corresponding to the second end 12e may alternatively be a recess 20b-1 or the recess 20c positioned laterally with respect to the second end 12e (in other words, in a direction along the first surface S1 and perpendicular to a longitudinal direction of the second signal line 12). As illustrated in FIGS. 4D and 4E, the recess 20 corresponding to the second end 12e may still alternatively be a recess 20d-1 or 20e positioned in a diagonal direction of the second end 12e (in other words, a direction between the longitudinal direction and a lateral direction of the second signal line 12).

Still alternatively, the recess 20 corresponding to the second end 12e may be formed by combining a plurality of recesses in the recesses 20a-1 to 20e. In the case where the plurality of recesses in the recesses 20a-1 to 20e are combined, the plurality of recesses thus combined may be disposed continuously or non-continuously.

The recess 20 positioned around the first end 11e and the recess 20 positioned around the second end 12e may be disposed continuously or non-continuously. Furthermore, the recess 20 positioned around the first end 11e and the recess 20 positioned around the second end 12e may be shaped symmetrically or asymmetrically with respect to a plane separating the first end 11e and the second end 12e. The plane has a normal line along a line segment connecting a center of the first end 11e and a center of the second end 12e and corresponds to a plane positioned equidistant from the center of the first end 11e and the center of the second end 12e.

<Action>

The first end 11e and the second end 12e are overlapped with the mount portion H1 and can thus be adopted as constituents respectively facing and electrically connected to two electrodes on a lower surface of the electronic element when the electronic element is mounted (e.g., flip chip mounted). The electronic element is configured to transmit a differential signal via the first signal line 11 and the second signal line 12.

On a differential signal transmission path including the first signal line 11 and the second signal line 12, when the first end 11e and the second end 12e are provided thereabove with a dielectric (e.g., an electronic element) bridging the first end 11e and the second end 12e, the dielectric acts to increase capacitance components between two differential signal lines and decrease characteristic impedance of the transmission path. The recess 20 positioned around the first end 11e and the second end 12e acts to decrease capacitance components around the recess 20 and increase the characteristic impedance of the transmission path. The recess 20 can thus reduce the action of decreasing the characteristic impedance of the transmission path due to positioning of the electronic element. This leads to characteristic impedance matching of the differential signal transmission path also below the electronic element and enhances broadband differential signal transmission characteristics.

<Details of Transmission Path>

The wiring board 1 may further satisfy the following conditions.

As illustrated in FIG. 3, at least part of the recess 20 may be positioned between the first end 11e and the second end 12e. This configuration can efficiently decrease capacitance components between the first end 11e and the second end 12e. This can efficiently reduce the action of increasing the capacitance components due to positioning a dielectric (e.g., an electronic element) above the first end 11e and the second end 12e to bridge these ends. This can enhance characteristic impedance matching on a transmission path overlapped with the mount portion H1.

As illustrated in FIG. 3, at least part of the recess 20 may be positioned on the extension of the first signal line 11 and adjacent to the first end 11e, as well as on the extension of the second signal line 12 and adjacent to the second end 12e. This configuration can efficiently reduce the action of increasing capacitance components at a terminal end of the first signal line 11 and capacitance components at a terminal end of the second signal line 12 due to a dielectric (e.g., an electronic element) on the mount portion H1. This can enhance characteristic impedance matching at a terminal end of the transmission path overlapped with the mount portion H1.

As illustrated in FIG. 3, the recess 20 may include a T-shape portion connecting a part between the first end 11e and the second end 12e and a part on the extension of the first signal line 11 and the extension of the second signal line 12. The recess may have a shape (e.g., a cross shape) formed by adding a different shape portion to the T-shape portion. This configuration can decrease capacitance components at a terminal end and between signal lines on a differential signal transmission path overlapped with the mount portion H1 and can enhance characteristic impedance matching on the transmission path.

The recess 20 may be nonconnected to the first signal line 11. In other words, a gap may be provided between the recess 20 and the first signal line 11 at a site where the recess 20 and the first signal line 11 are closest to each other. In the same or a similar manner, the recess 20 may be nonconnected to the second signal line 12. In other words, a gap may be provided between the recess 20 and the second signal line 12 at a site where the recess 20 and the second signal line 12 are closest to each other. In this configuration, a material for the first signal line 11 and the second signal line 12 is less likely to drop into the recess 20 during manufacture of the wiring board 1. This can reduce characteristic impedance mismatching due to such dropping.

As illustrated in FIG. 2B, the ground film conductor 35 positioned in the first conductor layer Ly1 of the insulating substrate 2 may include an ungrounded region D in a region R1 overlapped with the first end 11e and a region R2 overlapped with the second end 12e (shaded in the figure) in a plan perspective view. The ungrounded region D is a part not provided with the ground film conductor 35. The ungrounded region D does not need to be formed by cutting away the ground film conductor 35. The ground film conductor 35 may be formed except the part of the ungrounded region D. The ground film conductor 35 may include a plurality of ungrounded regions D disposed non-continuously, and the ungrounded region D in the region R1 and the ungrounded region D in the region R2 may be disposed non-continuously.

Impedance may be decreased at joints between the first and second ends 11e and 12e and the dielectric (e.g., an electronic element). The ungrounded regions D (see FIGS. 2B and 2C) in the regions R1 and R2 can decrease capacitance components between the first end 11e and the ground film conductor 35 and capacitance components between the second end 12e and the ground film conductor 35. This can reduce the action of increasing capacitance components on a transmission path due to the dielectric (e.g., an electronic element) on the mount portion H1 and can enhance characteristic impedance matching on the transmission path overlapped with the mount portion H1.

As illustrated in FIG. 2B, the ground film conductor 35 may include an ungrounded region D in a region R3 overlapped with part of the recess 20 (shaded in the figure) in a plan perspective view. The part of the recess 20 corresponds to a portion positioned between the first end 11e and the second end 12e. The ungrounded region D in the region R3 and the ungrounded region D in the region R1 or R2 may be disposed integrally or non-continuously.

The ungrounded region D in the region R3 can enhance the action by the recess 20 of decreasing the capacitance components between the first end 11e and the second end 12e. This can enhance characteristic impedance matching on the transmission path overlapped with the mount portion H1.

The recess 20 may include a joint 22 connected to the first ground line 31 and includes an inner side surface that may include a side surface ground conductor 37 (see FIGS. 1, 2A, 2C, and 3) extending from the joint 22 in a thickness direction of the insulating substrate 2. In this configuration, the side surface ground conductor 37 is less likely to cause stubbing of the first ground line 31 and can enhance characteristic impedance matching on a transmission path disposed below the mount portion H1. This can enhance transmission characteristics of the transmission path for a broadband differential signal.

The side surface ground conductor 37 may constitute part of a via conductor 38 positioned at the joint 22. The via conductor 38 corresponds to a conductor filled into a through-hole extending between the first surface S1 and the first conductor layer Ly1 of the insulating substrate 2. The via conductor 38 may be different in thickness or shape from the different ground via conductors 36 connected to the first to third ground lines 31 to 33 and may be manufactured in a process different from a process of manufacturing the plurality of ground via conductors 36. The via conductor 38 may exemplarily have an elongated hole shape. A process of manufacturing the wiring board 1 may include filling the through-hole for the via conductor 38 with the conductor and then forming the recess 20 so as to be partially overlapped with the through-hole to expose part of the via conductor 38 on the inner side surface of the recess 20. The side surface ground conductor 37 may correspond to such an exposed portion. Such a manufacturing method facilitates manufacture of the side surface ground conductor 37 positioned on the inner side surface of the recess 20.

The via conductor 38 connected to the recess 20 may be configured as a via conductor (so-called castellation) including an inner side surface provided with the conductor and a center portion passing through from the first surface S1 to the first conductor layer Ly1. This configuration thus adopted can enhance grounding of a transmission path and further stabilize high-frequency characteristics.

As illustrated in FIG. 3, the second ground line 32 may include a protrusion 32a projecting beyond the first signal line 11 in the longitudinal direction of the first signal line 11 and bent toward the first signal line 11 in a planar view. The protrusion 32a is provided to surround the first end 11e with the conductor having a ground potential also in a diagonal direction so as to increase the range of the first signal line 11 surrounded with the second ground line 32. This can enhance a grounding action on the first signal line 11 and transmission characteristics of a transmission path.

In the same or a similar manner, the third ground line 33 may include a protrusion 33a projecting beyond the second signal line 12 in the longitudinal direction of the second signal line 12 and bent toward the second signal line 12 in a planar view. The protrusion 33*a* is provided to surround the second end 12*e* with the conductor having a ground potential also in a diagonal direction so as to increase the range of the second signal line 12 surrounded with the third ground line 33. This can enhance a grounding action on the second signal line 12 and transmission characteristics of a transmission path.

The first signal line 11 may include a width-reduced portion 11*a* (see FIG. 3) positioned near the first end 11*e*. A width-reduced portion on a signal line corresponds to a part of a signal line having a narrower line width than parts ahead of and behind the width-reduced portion. Disposing near the first end 11*e* means disposing in a range equal to or less than twice the line width w1 (see FIG. 3) of the first signal line 11 from the first end 11*e*. Part of the width-reduced portion 11*a* may be overlapped with the mount portion H1 in a planar view. In this configuration, the width-reduced portion 11*a* can increase inductance components of the first signal line 11. Increasing the inductance components in this manner acts to cancel capacitance components added by the dielectric (e.g., an electronic element) on the mount portion H1 to thereby enhance characteristic impedance matching on the transmission path overlapped with the mount portion H1. This can enhance transmission characteristics of the transmission path for a broadband differential signal.

In the same or a similar manner, the second signal line 12 may include a width-reduced portion 12*a* (see FIG. 3) positioned near the second end 12*e*. Disposing near the second end 12*e* means disposing in a range equal to or less than twice the line width w2 (see FIG. 3) of the second signal line 12 from the second end 12*e*. Part of the width-reduced portion 12*a* may be overlapped with the mount portion H1 in a planar view. In this configuration, the width-reduced portion 12*a* can increase inductance components of the second signal line 12. Increasing the inductance components in this manner acts to cancel capacitance components added by the dielectric (e.g., an electronic element) on the mount portion H1 to thereby enhance characteristic impedance matching on the transmission path overlapped with the mount portion H1. This can enhance transmission characteristics of the transmission path for a broadband differential signal.

As illustrated in FIG. 3, the first signal line 11 and the recess 20 have a minimum distance L1 that may be shorter than a minimum distance L2 between the first signal line 11 and the second ground line 32. In this configuration, the recess 20 positioned close to the first signal line 11 can enhance the action on characteristic impedance of a transmission path. This can further enhance characteristic impedance matching on the transmission path overlapped with the mount portion H1.

In the same or a similar manner, the second signal line 12 and the recess 20 have a minimum distance L3 that may be shorter than a minimum distance L4 between the second signal line 12 and the third ground line 33. In this configuration, the recess 20 positioned close to the second signal line 12 can enhance the action on characteristic impedance of a transmission path. This can further enhance characteristic impedance matching on the transmission path overlapped with the mount portion H1.

The recess 20 has a width w21 at a part positioned between the first signal line 11 and the second signal line 12, and the width w21 may be wider than a line width w31 of the first ground line 31. The width w21 may be the maximum width if the part of the recess 20 has an inconstant width. Compared with a case where the width w21 is equal to or less than the line width w31, this configuration enlarges the recess 20 and shortens the distance between the recess 20 and the first signal line 11, as well as the distance between recess 20 and the second signal line 12. The recess 20 thus enhances the action on characteristic impedance of a transmission path to further enhance characteristic impedance matching on the transmission path overlapped with the mount portion H1. This can further enhance transmission characteristics for a broadband differential signal.

<Simulation Results>

Figure 5A:
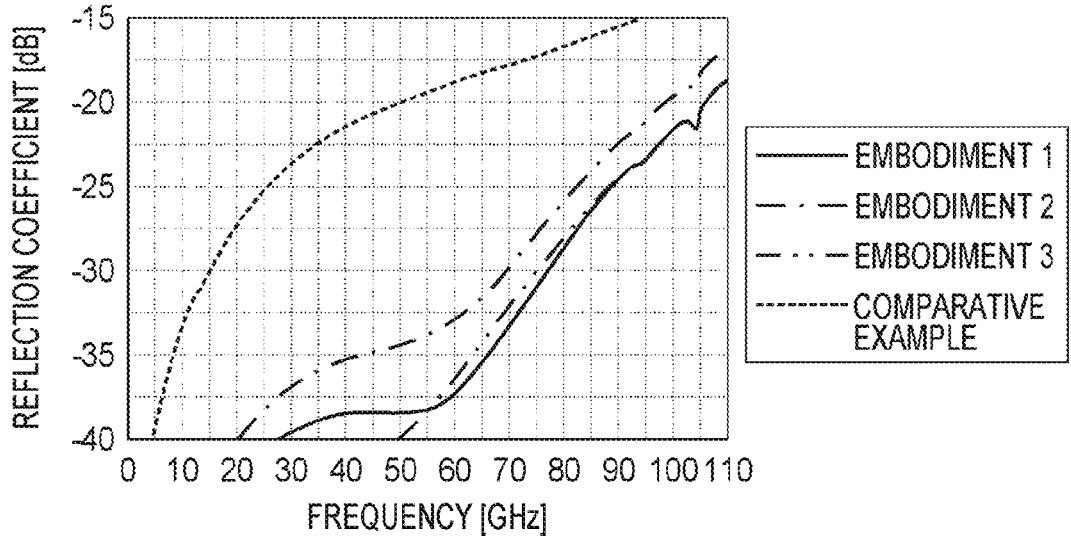
FIG. 5A is a graph indicating reflection characteristics of wiring boards according to embodiments 1 to 3 and a wiring board according to a comparative example.
Figure 5B:
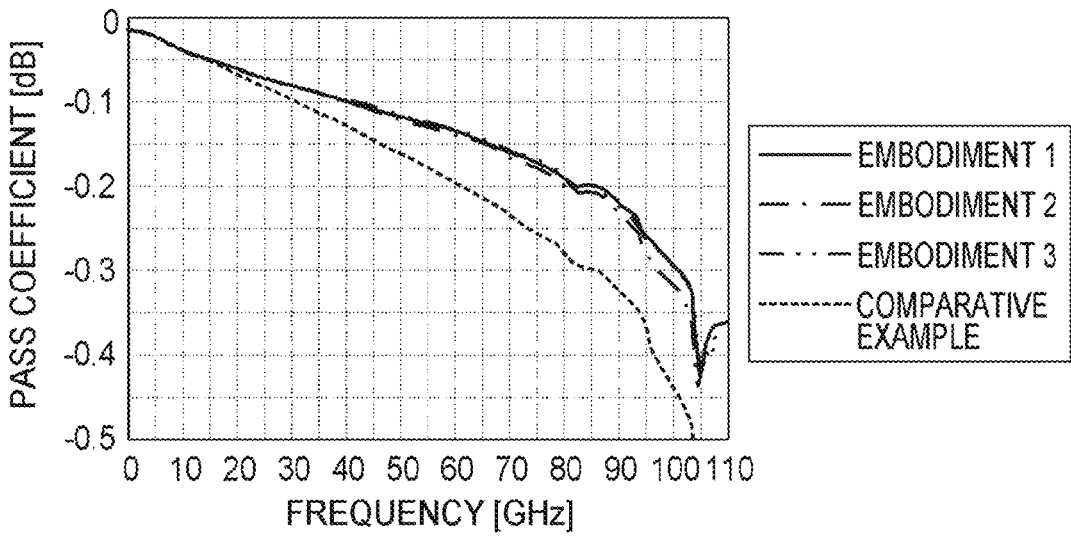
FIG. 5B is a graph indicating pass characteristics of the wiring boards according to embodiments 1 to 3 and the wiring board according to the comparative example.
Figure 5C:
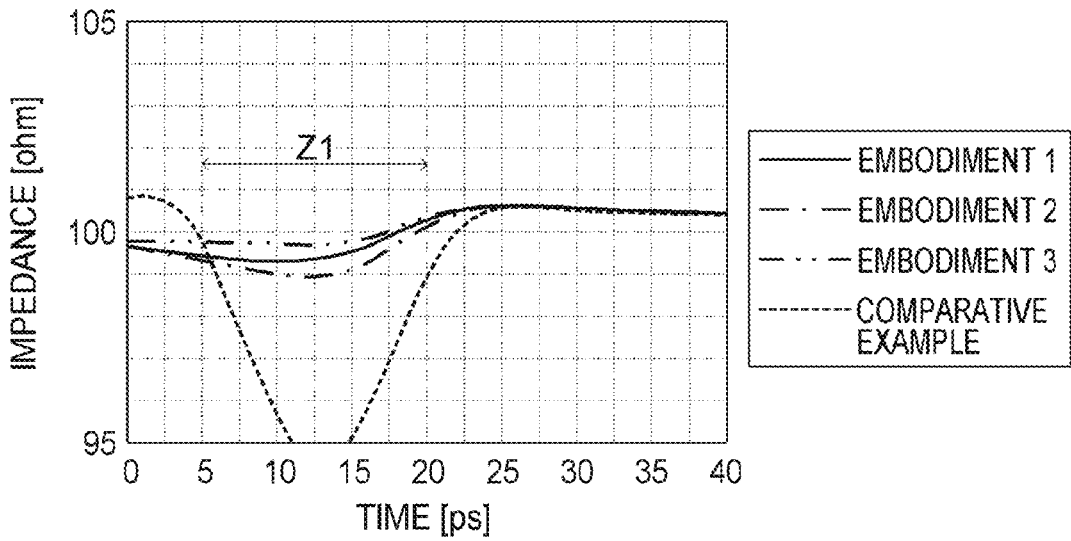
FIG. 5C indicates TDR (time domain reflectometry) measurement results of the wiring boards according to embodiments 1 to 3 and the wiring board according to the comparative example.
Figures 6, 7:
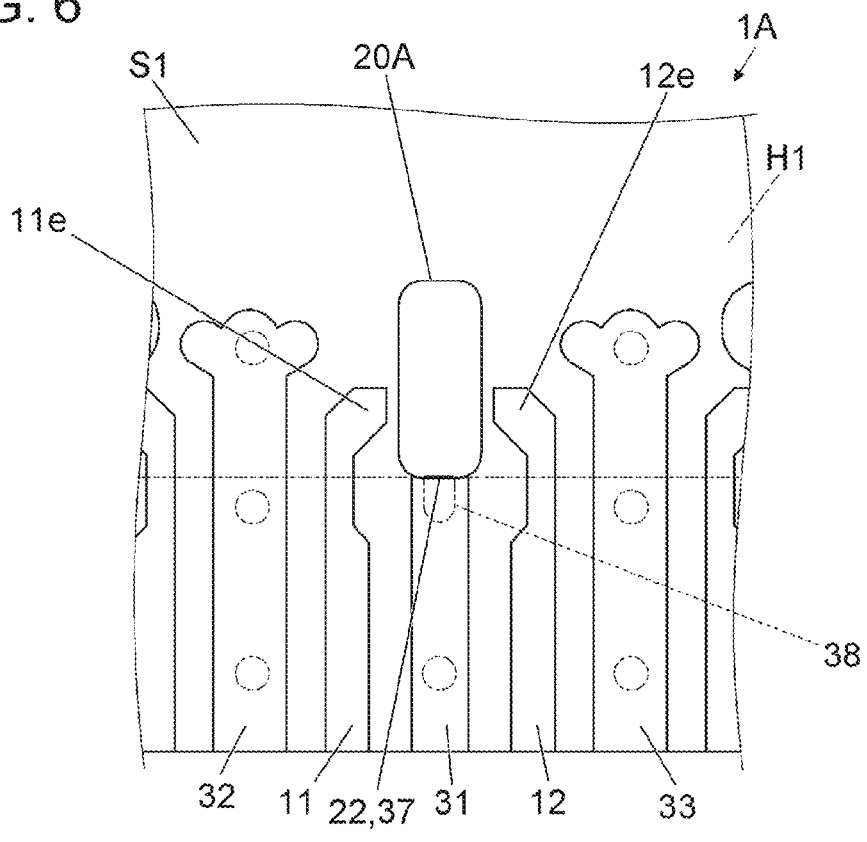
FIG. 6 is a plan view of a wiring board according to embodiment 2.
FIG. 7 is a plan view of a wiring board according to embodiment 3.

FIGS. 5A to 5C are graphs indicating frequency characteristics of wiring boards according to embodiments 1 to 3 and a wiring board according to a comparative example. FIG. 5A indicates reflection characteristics, FIG. 5B indicates pass characteristics, and FIG. 5C indicates TDR measurement results. FIG. 6 is a plan view of the wiring board according to embodiment 2. FIG. 7 is a plan view of the wiring board according to embodiment 3. A configuration of flip chip mounting the electronic element on the wiring board 1 is adopted as a condition for a simulation, and the electronic element has a relative dielectric constant $\varepsilon r=12$.

In embodiment 1, the wiring board 1 is configured as illustrated in FIGS. 1 to 3. That is, as illustrated in FIGS. 1 to 3, the recess 20 is positioned on the extensions of the first and second signal lines 11 and 12 and between the first signal line 11 and the second signal line 12 and includes the side surface ground conductor 37.

Embodiment 2 provides a wiring board 1A configured in the same or a similar manner to the wiring board 1 according to embodiment 1 except that a recess 20A is shaped differently. In embodiment 2, the recess 20A is positioned between the first end 11*e* and the second end 12*e*, but is not positioned on the extension of the first signal line 11 or on the extension of the second signal line 12. The recess 20A includes the side surface ground conductor 37.

Embodiment 3 provides a wiring board 1B configured in the same or a similar manner to the wiring board 1 according to embodiment 1 except that a recess 20B does not include the side surface ground conductor 37 (in other words, does not include the via conductor 38). The recess 20B is shaped identically to the recess 20 according to embodiment 1.

In the comparative example, the wiring board is configured in the same or a similar manner to the wiring board 1 according to embodiment 1 except that the wiring board does not include the recess 20 (that is, a portion corresponding to the recess 20 is filled with a material for the insulating substrate).

Compared with the wiring board according to the comparative example, in embodiments 1 to 3, the wiring boards 1, 1A, and 1B have a smaller broadband reflection coefficient (see FIG. 5A) and a larger broadband pass coefficient (FIG. 5B). In embodiments 1 to 3, the wiring boards 1, 1A, and 1B can thus achieve excellent broadband signal transmission. FIG. 5C indicating the TDR measurement results includes a time zone Z1 indicating characteristic impedance in a region overlapped with an electronic element on a transmission path. The results in FIG. 5 indicate that the recesses 20, 20A, and 20B thus provided enhance characteristic impedance matching of the wiring boards 1, 1A, and 1B according to embodiments 1 to 3 at a position below the electronic element.

Compared with embodiment 2, embodiment 1 has a smaller broadband reflection coefficient (see FIG. 5A) and a larger pass coefficient in a band equal to or more than 40 GHz (see FIG. 5B) and is enhanced in characteristic impedance matching in a region overlapped with an electronic device (see FIG. 5C). Accordingly, the recess 20 positioned on the extension of the first signal line 11 and the extension of the second signal line 12 can achieve more excellent signal transmission characteristics.

Compared with embodiment 3, embodiment 1 has a smaller reflection coefficient in a band from 55 GHz to 90 GHz (see FIG. 5A) and a larger pass coefficient in a band equal to or more than 80 GHz (see FIG. 5B). Accordingly, the side surface ground conductor 37 thus provided can achieve more excellent signal transmission characteristics.

Embodiment 4

Figure 8:
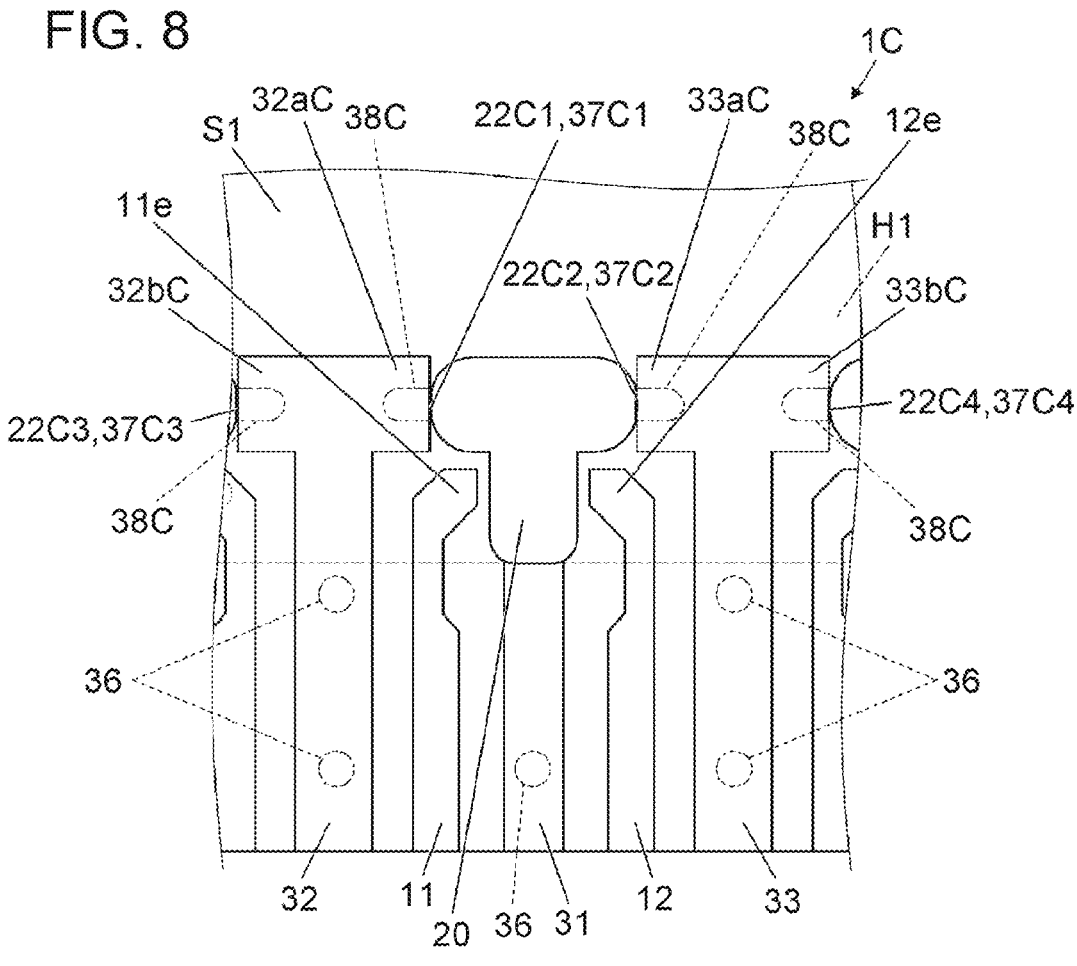
FIG. 8 is a plan view of a wiring board according to embodiment 4.

FIG. 8 is a plan view of a wiring board according to embodiment 4. Embodiment 4 provides a wiring board 1C configured in the same or a similar manner to the wiring board according to embodiment 1 except that a joint between the second ground line 32 and the recess 20 and a joint between the third ground line 33 and the recess 20 are structured differently from corresponding joints according to embodiment 1. Constituents the same as or similar to corresponding constituents according to embodiment 1 will be denoted by identical reference signs and will not be repeatedly described in detail.

The second ground line 32 may include a protrusion 32aC projecting beyond the first signal line 11 in the longitudinal direction of the first signal line 11 and bent toward the first signal line 11 in a planar view. The protrusion 32aC may be bent at a right angle or at any other angle. The protrusion 32aC may be connected to the recess 20 via a joint 22C1. The joint 22C1 may be disposed in a portion of the recess 20 positioned on the extension of the first signal line 11. The joint 22C1 may include a side surface ground conductor 37C1 extending from the joint 22C1 in the thickness direction of the insulating substrate 2. The side surface ground conductor 37C1 may constitute part of a via conductor 38C positioned at the joint 22C1. The via conductor 38C may correspond to the conductor filled into the through-hole extending between the first surface S1 and the first conductor layer Ly1 of the insulating substrate 2. The via conductor 38C may alternatively be configured as a via conductor (so-called castellation) including an inner side surface provided with the conductor and a center portion passing through from the first surface S1 to the first conductor layer Ly1. In this configuration, the conductor positioned on the inner side surface of the via conductor 38C may correspond to the side surface ground conductor 37C1. Provision of the joint 22C1 between the recess 20 and the second ground line 32, as well as provision of the side surface ground conductor 37C1, can enhance a grounding action on a transmission path to further enhance transmission characteristics.

The second ground line 32 may include the same or similar constituents (a protrusion 32bC, a joint 22C3, a side surface ground conductor 37C3, and the via conductor 38C) for each of the recesses 20 in the transmission paths 6 adjacent to each other (see FIG. 1).

In the same or a similar manner, the third ground line 33 may include a protrusion 33aC projecting beyond the second signal line 12 in the longitudinal direction of the second signal line 12 and bent toward the second signal line 12 in a planar view. The protrusion 33aC may be bent at a right angle or at any other angle. The protrusion 33aC may be connected to the recess 20 via a joint 22C2. The joint 22C2 may be disposed in a portion of the recess 20 positioned on the extension of the second signal line 12. The joint 22C2 may include a side surface ground conductor 37C2 extending from the joint 22C2 in the thickness direction of the insulating substrate 2. The side surface ground conductor 37C2 may constitute part of the via conductor 38C positioned at the joint 22C2. The via conductor 38C may correspond to the conductor filled into the through-hole extending between the first surface S1 and the first conductor layer Ly1 of the insulating substrate 2. The via conductor 38C may alternatively be configured as a via conductor (so-called castellation) including an inner side surface provided with the conductor and a center portion passing through from the first surface S1 to the first conductor layer Ly1. In this configuration, the conductor positioned on the inner side surface of the via conductor 38C may correspond to the side surface ground conductor 37C2. Provision of the joint 22C2 between the recess 20 and the third ground line 33, as well as provision of the side surface ground conductor 37C2, can enhance a grounding action on a transmission path and transmission characteristics.

The third ground line 33 may include the same or similar constituents (e.g., a protrusion 33bC, a joint 22C4, a side surface ground conductor 37C4, and the via conductor 38C) for each of the recesses 20 in the transmission paths 6 adjacent to each other (see FIG. 1).

(Electronic Device)

Figure 9:
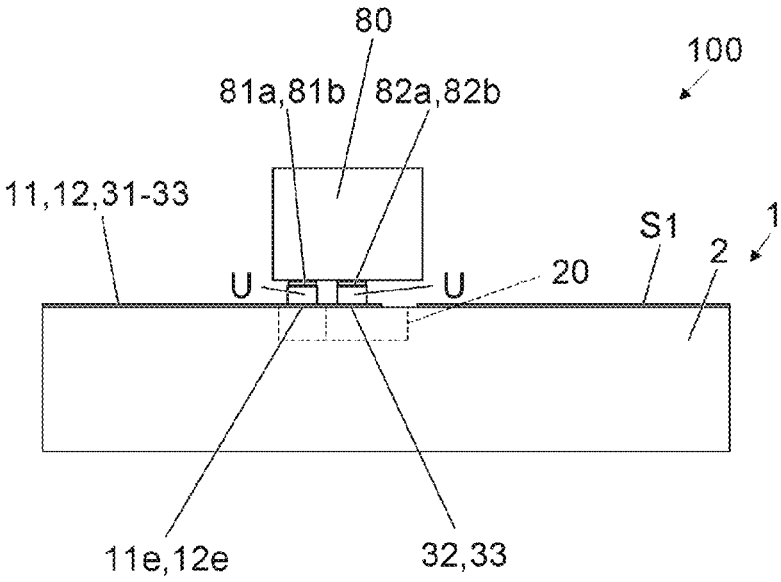
FIG. 9 is a side view of an electronic device according to an embodiment of the present disclosure.

FIG. 9 is a side view of an electronic device according to an embodiment of the present disclosure. The present embodiment provides an electronic device 100 including the wiring board 1 and an electronic element 80 mounted on the mount portion H1 of the wiring board 1. The wiring board 1 may be replaced with any one of the wiring boards 1A to 1C according to embodiments 2 to 4. The electronic element 80 includes a lower surface provided with electrodes 81a and 81b that may be connected (e.g., flip chip mounted) respectively to the first end 11e of the first signal line 11 and the second end 12e of the second signal line 12 on the wiring board 1 via a bonding material U such as a copper pillar. The electronic element 80 further includes ground electrodes 82a and 82b disposed on the lower surface, and the ground electrodes 82a and 82b may be connected respectively to the second ground line 32 and the third ground line 33 via the bonding material U such as a copper pillar. The electronic element 80 may be configured to input, to output, or to input and output a differential signal via the electrodes 81a and 81b. The electronic element 80 may be an element including a substrate with a larger relative dielectric constant compared with an $SiO_2$ film. Examples of the electronic element 80 include a silicon substrate and an InP (indium phosphide) substrate.

In the present embodiment, the electronic device 100 includes the wiring board 1 so as to achieve excellent broadband signal transmission characteristics.

The embodiments of the present disclosure have been described above. The wiring board and the electronic device according to the present disclosure are not limited to those according to the above embodiments. For example, the above embodiments each describe the first signal line 11 and the second signal line 12 configured to transmit a differential signal. Alternatively, the first signal line and the second signal line may each be configured to transmit a single-ended signal. Still alternatively, the first signal line and the second signal line may each be configured to transmit a digital signal or an analog signal.

In the embodiments and the variations, characterized parts may be combined variously without being limited to exemplifications according to the above embodiments. Furthermore, combination is applicable among the embodiments, as well as among the variations.

INDUSTRIAL APPLICABILITY

The present disclosure is applicable to a wiring board and an electronic device.

REFERENCE SIGNS 1, 1A, 1B, 1C wiring board
2 insulating substrate
6 transmission path
11 first signal line
11a width-reduced portion
11e first end
12 second signal line
12a width-reduced portion
12e second end
20, 20a to 20e, 20a-1, 20b-1, 20d-1, 20A, 20B recess
22, 22C1 to 22C4 joint
31 first ground line
32 second ground line
32a, 32aC protrusion
33 third ground line
33a, 33aC protrusion
35 ground film conductor
36 ground via conductor
37, 37C1 to 37C4 side surface ground conductor
38, 38C via conductor
L1 to L4 minimum distance
H1 mount portion
Ly1 first conductor layer
S1 first surface
w1, w2, w31 line width
w21 width
80 electronic element
100 electronic device

The invention claimed is:

1. A wiring board comprising: an insulating substrate including a first surface; a mount portion positioned on the first surface and equipped with an electronic element; a first signal line and a second signal line positioned parallel to each other on the first surface; and a recess positioned on the first surface; wherein the recess is positioned around a first end of the first signal line and a second end of the second signal line, and at least part of the recess, the first end, and the second end are overlapped with the mount portion in a planar view, wherein the insulating substrate includes a first conductor layer provided with a ground film conductor, the ground film conductor includes an ungrounded region, and the ungrounded region is overlapped with the first end and the second end in a plan perspective view.

2. The wiring board according to claim 1, wherein
at least part of the recess is positioned between the first end and the second end.

3. The wiring board according to claim 1, wherein
at least part of the recess is positioned on an extension of the first signal line and adjacent to the first end, or on an extension of the second signal line and adjacent to the second end.

4. The wiring board according to any one of claim 1, wherein the first signal line and the recess are not connected to each other, and the second signal line and the recess are not connected to each other.

5. The wiring board according to claim 1, wherein
the ungrounded region is overlapped with the recess positioned between the first end and the second end in a plan perspective view.

6. The wiring board according to any one of claim 1, the wiring board further comprising
a first ground line positioned between the first signal line and the second signal line, wherein
the recess includes a joint connected to the first ground line,
the recess includes an inner side surface provided with a side surface ground conductor extending from the joint in a thickness direction of the insulating substrate.

7. The wiring board according to any one of claim 1, the wiring board further comprising
a second ground line positioned opposite to the second signal line with respect to the first signal line and parallel to the second signal line, wherein
the second ground line includes a protrusion projecting beyond the first signal line in a longitudinal direction of the first signal line and bent toward the first signal line in a planar view.

8. The wiring board according to claim 7, wherein
the protrusion is connected to the recess.

9. The wiring board according to claim 8, the wiring board comprising
a side surface ground conductor extending in a thickness direction of the insulating substrate from a joint between the protrusion and the recess.

10. The wiring board according to any one of claim 1, wherein
the first signal line includes a width-reduced portion positioned near the first end.

11. The wiring board according to any one of claim 1, the wiring board comprising
a second ground line positioned opposite to the second signal line with respect to the first signal line and parallel to the second signal line, wherein
the first signal line and the recess have a minimum distance shorter than a minimum distance between the first signal line and the second ground line.

12. The wiring board according to any one of claim 1, the wiring board comprising
a first ground line positioned between the first signal line and the second signal line, wherein
the recess positioned between the first signal line and the second signal line has a width wider than a line width of the first ground line.

13. An electronic device comprising:
the wiring board according to any one of claim 1; and
an electronic element mounted on the mount portion.

* * * * *